(12) United States Patent
Parameshwaran et al.

(10) Patent No.: US 7,804,317 B1
(45) Date of Patent: Sep. 28, 2010

(54) TEST DEVICE FOR DETERMINING CHARGE DAMAGE TO A TRANSISTOR

(75) Inventors: Biju Parameshwaran, Union City, CA (US); Sriram Madhavan, Santa Clara, CA (US); Andrew E. Carlson, Berkeley, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 647 days.

(21) Appl. No.: 11/583,758

(22) Filed: Oct. 19, 2006

(51) Int. Cl.
*G01R 31/26* (2006.01)
(52) U.S. Cl. .................................................. 324/765
(58) Field of Classification Search .................. 324/765, 324/763, 769, 158.1; 327/525, 526; 361/56, 361/91
See application file for complete search history.

(56) References Cited

U.S. PATENT DOCUMENTS 5,561,373 A * 10/1996 Itoh ......................... 324/158.1
6,570,433 B2 * 5/2003 Aipperspach et al. ....... 327/525

* cited by examiner

*Primary Examiner*—Ha Tran T Nguyen
*Assistant Examiner*—Tung X Nguyen
(74) *Attorney, Agent, or Firm*—Farjami & Farjami LLP

(57) ABSTRACT

According to one exemplary embodiment, a test device includes a transistor situated on a substrate. The test device further includes a protection device coupled by a fuse to a gate of the transistor in an interconnect metal layer, where the interconnect metal layer is formed over the substrate. The fuse allows the protection device to be decoupled from the gate of the transistor prior to testing the transistor. The test device further includes first and second contact pads formed over the substrate and coupled to respective terminals of the fuse to provide access to the fuse. A current can be applied between the first and second contacts pads to cause the fuse to open to decouple the protection device from the gate of the transistor. The test device further includes an antenna coupled to the gate of the transistor with interconnect metal segments for accumulating electrical charge during wafer processing.

8 Claims, 4 Drawing Sheets

TEST DEVICE FOR DETERMINING CHARGE DAMAGE TO A TRANSISTOR

1. TECHNICAL FIELD

The present invention is generally in the field of semiconductors. More particularly, the invention is in the field of testing semiconductor devices.

2. BACKGROUND ART

During Integrated Chip (IC) fabrication, the semiconductor wafer on which the chips are fabricated are processed through a multitude of fabrication steps like oxidations, thin film depositions, doping implants, photolithography and plasma etching. Some of these steps like plasma etching and film deposition processes, can cause electrical charge to accumulate on interconnect metal interconnect segments that are coupled to the transistor. The accumulated charge can cause damage to the transistor by discharging through the transistor to the substrate (i.e. ground). For example, accumulated charge on interconnect metal segments that are coupled to a gate of a transistor can discharge through the gate and, thereby, damage the transistor's thin gate oxide. The short-term and long-term characteristics and reliability of the transistors are affected by such discharge events.

With the scaling of technology, it has becoming increasingly important to study, characterize and isolate the causes of charging damage in the fabrication process. The gate dielectrics are becoming increasingly thinner, and the number of interconnect levels are increasing with each technology generation. To determine how much charge damage has occurred to a transistor as a result of wafer processing, characterization structures are designed and placed in the scribe lines. The characterization test structures are designed to have different lengths of interconnects connected to the gates of transistors to mimic what happens on the actual IC. These long interconnects usually connected to the gate are usually referred to as antennas. There is usually a matrix of test structures with connection to interconnect antennas at different metal levels. The characterization can be performed on real production wafers or on test wafers which only get processed through a part of the actual fabrication process. After a desired number of interconnect metal layers have been fabricated, the wafer designated for characterization can be tested for charge damage. The characterization usually involves measurement of transistor characteristics like drive current, threshold voltage, gate leakage current, sub-threshold slopes, transconductance, etc. The damage is assessed by comparison to a reference transistor with no antenna attached to it.

Since the charge collected accumulates through processing of the interconnect levels, it is desired to measure the cumulative damage to the transistor though the full processing flow. It is also desirable to understand and isolate which particular step or series of steps is responsible for the most damage. So, in addition to the measurement of cumulative damage where antennas are connected to the gate at all interconnect levels, it is a known art in the industry to connect antennas to a given metal level (e.g. M1) and to have an antenna-protection device like a diode connected at the level one above (M2 here) so that the diode can shunt all the charge from processing interconnect levels above the level of interest (M1 here).

However, the presence of the diode in parallel with the transistor gate interferes with certain characterization measurements where the diode gets forward-biased and conducts currents to the substrate preventing the transistor from being properly biased for the measurement.

Also, it is desirable to be able to characterize all the interconnect metal level charging on a single wafer which has been processed through the whole flow to avoid wafer-to-wafer and lot-to-lot variations present in the fabrication process. So in order that valuable wafer processing time is not consumed in measurement and characterization at each interconnect level, it is desirable that the measurements be done at the end of the process flow. In addition, it is not uncommon in fabrication facilities that the wafer has to be removed from the cleanroom environment for measurement, in which case it is undesirable to put the wafer back into the fabrication cleanroom once the measurement is done for fear of contamination during testing and measurement.

SUMMARY

The present invention is directed to a test device for determining charge damage to a transistor. The present invention addresses and resolves the need in the art for an effective test device for determining damage to a transistor from charge that accumulates during wafer processing.

According to one exemplary embodiment, a test device includes a transistor situated on a substrate. The test device further includes a protection device coupled by a fuse to a gate of the transistor in an interconnect metal layer, where the interconnect metal layer is formed over the substrate. For example, the protection device can be a diode having a cathode coupled to the fuse and an anode coupled to the substrate. The fuse can be formed in the interconnected metal layer at which the diode is electrically connected to the gate of the transistor, for example. The fuse allows the protection device to be decoupled from the gate of the transistor prior to testing the transistor.

According to one exemplary embodiment, the test device further includes first and second contact pads formed over the substrate, where the first and second contact pads are coupled to respective first and second terminals of the fuse to provide access to the fuse. A current can be applied between the first and second contacts pads to cause the fuse to open to decouple the protection device from the gate of the transistor. The test device further includes third and fourth contact pads situated over the substrate, where the third and fourth contact pads are coupled to the respective source and drain of the transistor. The test device further includes an antenna coupled to the gate of the transistor, where the antenna includes a number of interconnect metal segments for accumulating electrical charge during wafer processing.

The fuse structure is designed such that the current required to blow the fuse is low enough so that the gate in parallel with the fuse does not get damaged. This fuse design can be done using contemporary semiconductor processes without the addition of extra steps. This should also be feasible since the gate resistance is at least a few orders of magnitude higher than the blown resistance, thus limiting the current through the gate oxide to negligible values and hence not causing any additional damage.

The present invention also comprises a method for testing a transistor in an embodiment of the invention for charge damage, and a test system that includes one or more embodiments of the test device described in the present application. Other features and advantages of the present invention will become more readily apparent to those of ordinary skill in the art after reviewing the following detailed description and accompanying drawings.

DETAILED DESCRIPTION OF THE INVENTION

The present invention is directed to a test device for determining charge damage to a transistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
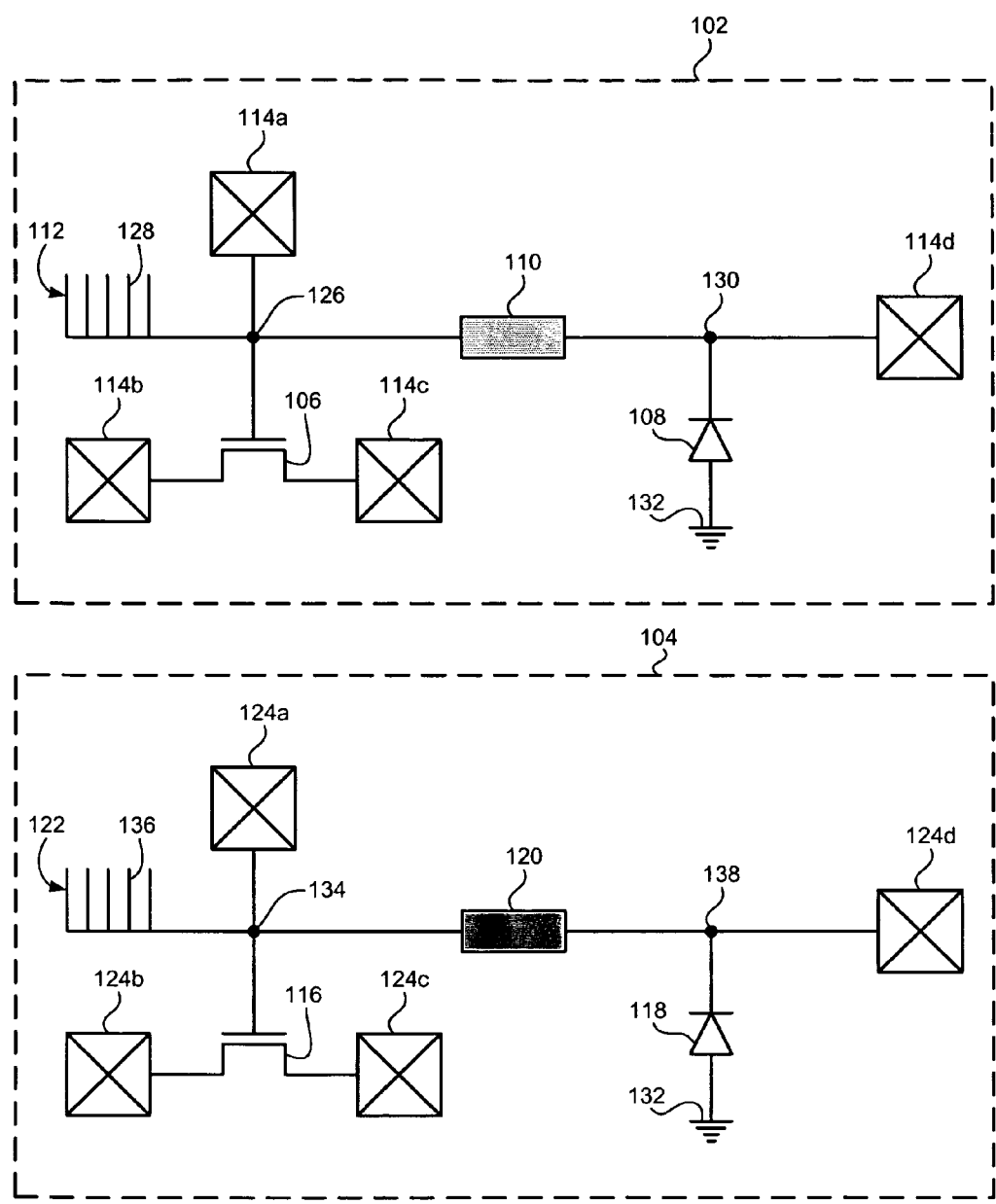
FIG. 1 illustrates a circuit diagram of exemplary test devices in accordance with one embodiment of the present invention.

FIG. 1 shows a schematic diagram of two exemplary test devices in accordance with one embodiment of the present invention. Test devices 102 and 104 are exemplary test devices that can be situated in a test wafer or on a production wafer in the scribe lines (not shown in FIG. 1) and utilized to determine damage to a transistor that is caused by electrical charge that can accumulate from fabrication processes, such as plasma etch and deposition process, during wafer processing. Test device 102 includes transistor 106, protection device 108, fuse 110, antenna 112, and contact pads 114a, 114b, 114c, and 114d. Test device 104 includes transistor 116, protection device 118, fuse 120, antenna 122, and contact pads 124a, 124b, 124c, and 124d. Test devices 102 and 104 are fabricated on the same test wafer. The difference may be that the antenna may be formed by interconnects at different metal levels. In such a case, the level of connection of the protection device and the fuse have to be modified accordingly as noted before. It is noted that in describing the formation of the various components of test devices 102 and 104, reference is made to a test wafer, a semiconductor substrate, and interconnect metal layers, which are not shown in FIG. 1.

As shown in FIG. 1, the gate of transistor 106 is coupled to a first terminal of fuse 110, antenna 112, and contact pad 114a at node 126. Transistor 106 can be a field effect transistor (FET) and can be formed on a semiconductor substrate in a test wafer. Fuse 110 can comprise metal and can be formed in an interconnect metal layer in a test wafer. In one embodiment, fuse 110 can comprise silicided polycrystalline silicon (polysilicon). Antenna 112 includes interconnect metal segments 128, which correspond to interconnect metal segments that are typically coupled to a gate of a transistor that is used in a circuit in a semiconductor die. Antenna 112 can be fabricated in a first interconnect metal layer (i.e. M1) of the test wafer, for example. Antenna 112 can be utilized to collect electrical charge that occurs from fabrication processes, such as plasma etching and deposition processes that are used in the fabrication of interconnect metal layers that overlie transistor 106. Connection from contact pad 114a can be made in the next interconnect level (i.e. M2) to provide connection between the gate of transistor 126 and to the first terminal of fuse 110, which connects to the protection device. When such a connection is made at M2, the charge collected during processing from all layers above and including M2 is shunted to the substrate through the protection device, and hence not damaging the gate oxide of the transistor. In this case, the damage resulting from the antenna connected at M1 to the transistor can be isolated. Similar test circuit arrangements can be isolate the damage from other interconnect layers up to the penultimate metal layer.

Also shown in FIG. 1, contact pad 114b is coupled to the source of transistor 106 and contact pad 114c is coupled to the drain of transistor 106. Contact pads 114b and 114c provide access to the respective source and drain of transistor 106. Further shown in FIG. 1, the second terminal of fuse 110 is coupled to contact pad 114d and the cathode of protection device 108 at node 130 and the anode of protection device 108 is coupled to ground 132. Contact pad 114d provides access to the second terminal of fuse 110.

Protection device 108 is coupled by fuse 110 to the gate of transistor 106 in a selected interconnect metal layer in the test wafer. Protection device 108 is utilized to shunt to ground (i.e. the substrate) electrical charge that occurs during formation of the selected interconnect metal layer (i.e. the interconnect metal layer in which protection device 108 is coupled to the gate of transistor 106) and any overlying interconnect metal layer(s) and/or dielectric layers. For example, if protection device 108 is coupled to the gate of transistor 106 in a second interconnect metal layer (i.e. M2) in the test wafer, then protection device 108 can shunt to ground 132 (i.e. the substrate) electrical charge that occurs as a result of forming M2 and any interconnect metal layer(s) and dielectric layer(s) that are formed over M2. The electrical charge is shunted to the substrate (i.e. ground 132) by forward biasing protection device 108. In the present embodiment, protection device 108 can be a diode having a cathode coupled to fuse 110 and an anode coupled to the substrate. In another embodiment, a protection device 108 may comprise a charge-shunting semiconductor device other than a diode. Protection device 108 can be formed on the substrate of the test wafer during formation of transistor 106.

During fabrication of test device 102, transistor 106 can be formed on the substrate of the test wafer. After transistor 106 has been formed, dielectric and interconnect metal layer(s) can be formed over transistor 106 by utilizing fabrication processes, such as plasma etch and deposition processes, which can cause electric charge to accumulate on interconnect metal segments that are coupled to the gate of transistor 106. The accumulated electrical charge that is coupled to the gate of transistor 106 can cause damage to the transistor. For example, the accumulated charge can discharge through the gate of transistor 106 to the underlying substrate and, thereby, damage the transistor's gate oxide layer. In test device 102, protection device 108 is coupled to the gate of transistor 106 by fuse 110 in a selected interconnect metal layer such that any electrical charge that results from the formation of the selected interconnect metal layer and any overlying dielectric and interconnect metal layer(s) is shunted to the substrate. This mechanism can be used for protection of the reference device, mentioned before by connecting the fuse and the diode protection device at the lowermost metal layer (M1) and not purposely connecting any antenna structure to it.

After test device 102 has been fabricated, damage to transistor 106 caused by electrical charge that accumulated on the gate of transistor 106 prior to coupling of protection device 106 to the gate in the selected interconnect metal layer can be determined by testing transistor 106. However, since protection device 108 can interfere with the testing of transistor 106, it is necessary to decouple protection device 108 from the gate of transistor 106 before testing the transistor. This happens in measurement biasing conditions which will shunt current to the substrate by forward-biasing the diode, and hence preventing the bias from being applied to the gate of the measured transistor. In the present embodiment, protection device 108 can be disconnected from the gate of transistor 106 by applying a sufficient amount of current through contact pads 114a and 114d to cause fuse 110 to open. After protection device 108 has been decoupled, the charge damage to transistor 106 from wafer fabrication processes (e.g. plasma etch and deposition processes) that were performed prior to formation of the selected interconnect metal layer can be determined by appropriately testing transistor 106. For example, a transistor parameter such as leakage current can be measured via contact pads (e.g. contacts pads 114a, 114b, and 114c) and compared to a reference value to determine how much charge damage has occurred to transistor 106.

Also, since accumulated charge affects the parameters (e.g. leakage current) of the transistor during testing, the amount of charge that accumulated on the gate of transistor 106 prior to formation of the selected interconnect metal layer can be determined by measuring one or more of the parameters of transistor 106. By coupling protection device 108 to a third interconnect metal layer (i.e. M3) in the test wafer, for example, damage to transistor 106 caused by charge that accumulated prior to formation of M3 can be determined by testing one or more parameters of transistor 106 after decoupling protection device 108 from the transistor's gate.

Further shown in FIG. 1, in test device 104, the gate of transistor 116 is coupled to antenna 122, a first terminal of fuse 120, and contact pad 124a at node 134, and contact pads 124b and 124c are coupled to the respective source and drain of transistor 116. Transistor 116 is substantially similar in formation, size, and composition to transistor 106 in test device 102. Also antenna 122, which includes metal interconnect segments 136, and contact pads 124a, 124b, and 124c are substantially similar in composition, size, and formation to antenna 112 and contact pads 114a and 114b in test device 102, respectively. Also shown in FIG. 1, the second terminal of fuse 120, the cathode of protection device 118, and contact pad 124d are coupled to node 138, and the anode of protection device 118 is coupled to ground 132 (i.e. the substrate of the test wafer).

Protection device 118 and contact pad 124d are substantially similar in composition, size, and formation to protection device 108 and contact pad 114d in test device 102, respectively. Fuse 120 is substantially similar in composition and size to fuse 110 in test device 102. However, fuse 120 in test device 104 is coupled to the gate of transistor 116 in a different interconnect metal layer than the interconnect metal layer in which fuse 110 is coupled to the gate of transistor 106. For example, fuse 120 in test device 104 can be coupled to the gate of transistor 116 in M3 and fuse 110 in test device 102 can be coupled to the gate of transistor 106 in M2. Thus, in the above example, transistor 106 in test device 102 can be tested after opening fuse 110 to determine charge damage caused by wafer processing prior to formation of M2 and transistor 116 in test device 104 can be tested after opening fuse 120 to determine charge damage caused by wafer processing prior to formation of M3.

Thus, in the embodiment in FIG. 1, transistors 106 and 116, which are formed on a substrate in the same test wafer, can be tested for charge damage caused by fabrication processes utilized to form a different number of interconnect metal layers in the test wafer. As a result, the embodiment of the invention in FIG. 1 allows charge damage to transistors formed on a substrate in the same test wafer but exposed to the fabrication of a different number of interconnect metal layers to be compared to assist in determining which fabrication processes cause the greatest amount of charge damage. In contrast, in a conventional test procedure, a test wafer may have to be removed from the fabrication cleanroom and tested after a desired interconnect metal layer has been fabricated over a transistor in a test wafer. Thus, to test for charge damage to a transistor caused by formation of a different interconnect metal layer in the conventional test procedure, a different test wafer must be fabricated, which consumes additional wafer processing time. In addition, comparison between different test wafers processed at different times may be difficult if there are process variations present, which is likely in early stages of technology development since the process is immature. Thus, by allowing multiple test devices to be formed on the same test wafer, where each test device can be utilized to test a transistor to determine charge damage caused by formation of a different number of interconnect metal layers, an embodiment of the invention advantageously saves wafer processing time and test wafers.

Figure 2:
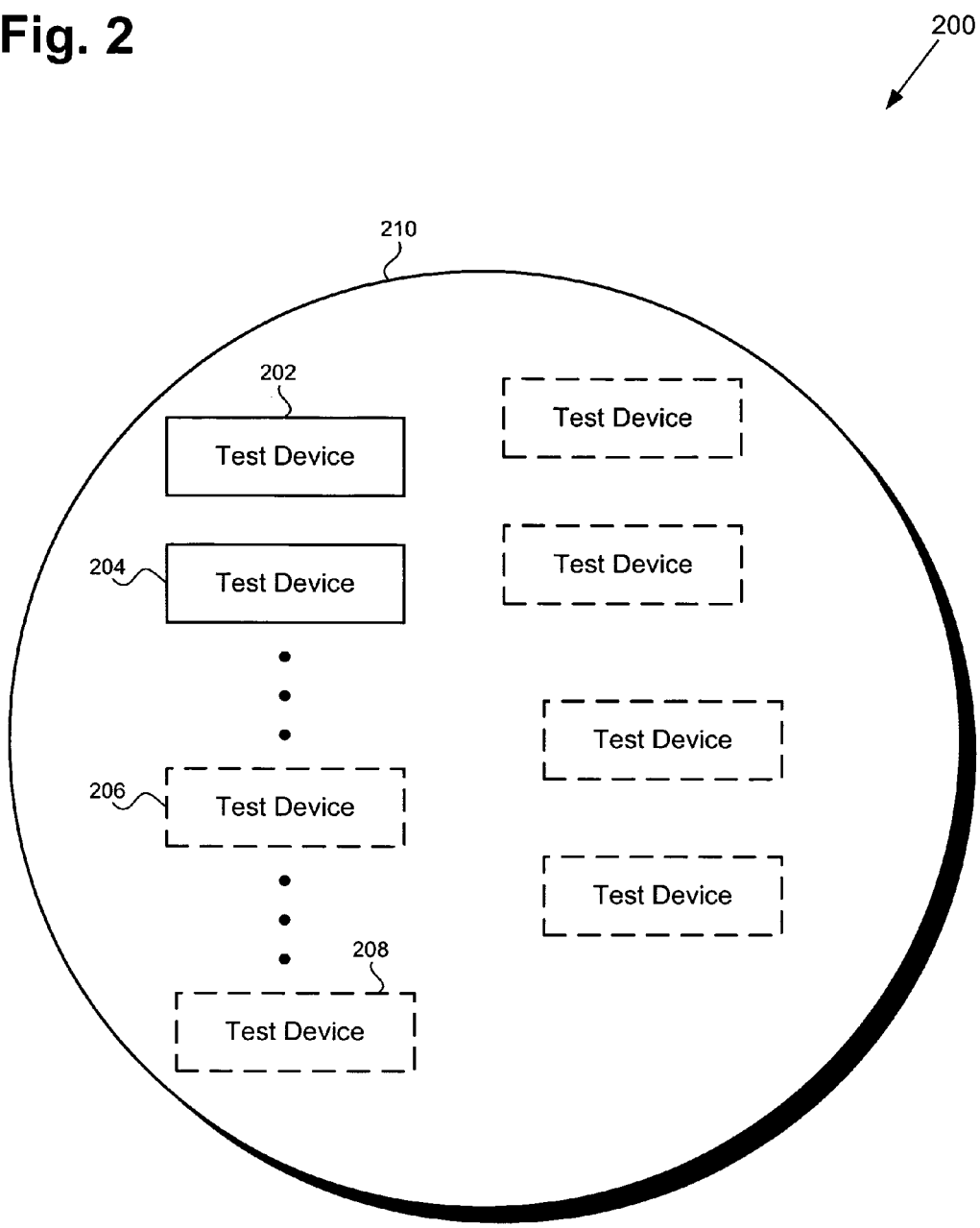
FIG. 2 illustrates a top view of an exemplary test wafer or production wafer, including exemplary test devices in accordance with one embodiment of the invention.

FIG. 2 shows a top view of an exemplary test block including a number of exemplary test devices in an exemplary wafer under test in accordance with one embodiment of the present invention. Test block 200 includes wafer under test 210 (i.e. a test wafer), which includes test devices, such as test devices 202 and 204, which are fabricated in wafer under test 210. Test devices 202 and 204 correspond, respectively, to test devices 102 and 104 in FIG. 1. Test block 200 can also include a number of other similar test devices, such as test devices 206 and 208. In one embodiment, wafer under test 210 can include one test device, such as test device 202 or 204. It is to be noted also that the test devices can be positioned in the scribe line area of standard production wafers, and that separate test wafers are not necessary to do the charge damage characterization of a process.

Each test device in wafer under test 210 comprises a fuse that couples a protection device to a gate of a transistor in a different interconnect metal layer in wafer under test 210. Thus, for example, test device 202 can comprises a fuse that couples a protection device to a gate of a transistor in M2 and test device 204 can comprise a fuse that couples a protection device to a gate of a transistor in M3.

The fuse (e.g. fuse 110 in test device 102 in FIG. 1) in each test device can be opened by applying a sufficiently large current through the appropriate test pads (e.g. test pads 114a and 114d). By opening the fuse in each test device, the protection device (e.g. protection device 108) can be decoupled from the gate of the transistor (e.g. transistor 106) such that each transistor can be tested to determine charge damage. By decoupling the protection device from the transistor gate, the invention advantageously prevents the protection device (e.g. a diode) from interfering with the testing of the transistor.

Since each test device in wafer under test 210 includes a protection device that is coupled by a fuse to a transistor gate in a different selected interconnect metal layer, wafer under test 210 allows a comparison of transistor damage from accumulated electrical charge caused by fabrication processes (e.g. plasma processes) that are used to form interconnect metal layer(s) prior to formation of each selected interconnect metal layer. The transistor damage data that results from fabrication processes used to form different interconnect metal layers can be advantageously utilized to isolate the amount of charge damage that results from formation of each interconnect metal layer.

Figure 3:
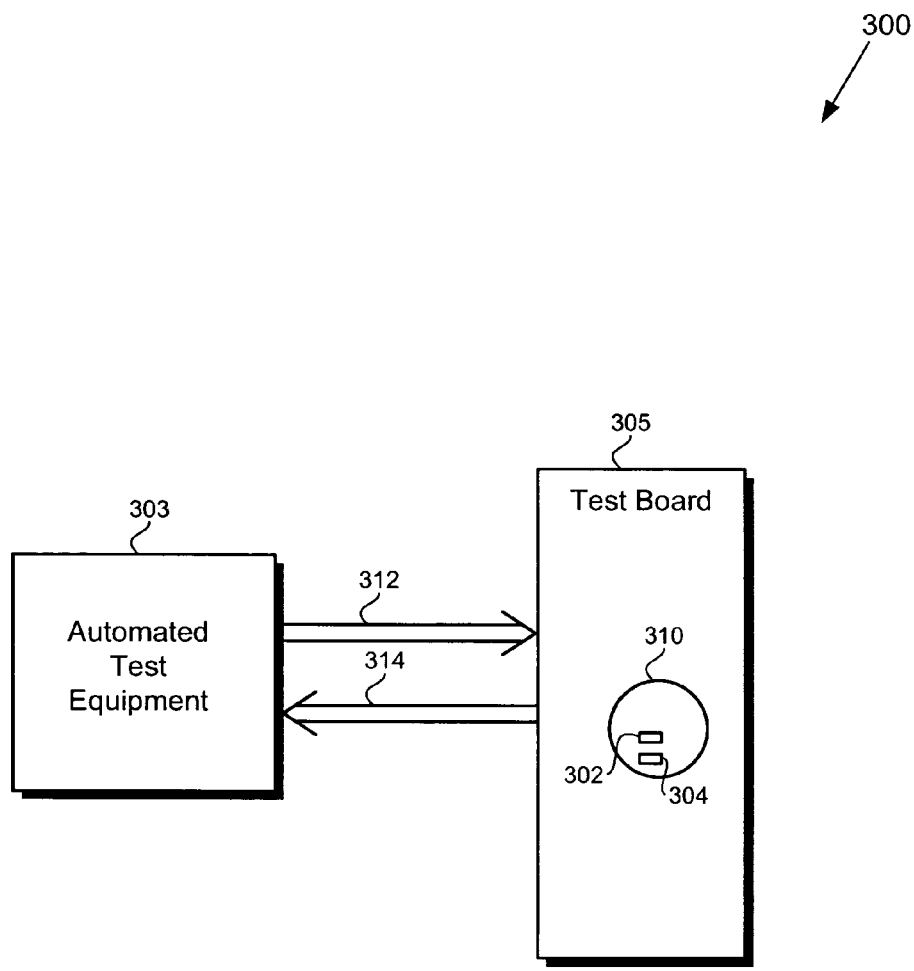
FIG. 3 illustrates a diagram of an exemplary test system including an exemplary wafer under test with one or more exemplary test devices in accordance with one embodiment of the present invention.

FIG. 3 illustrates a diagram of an exemplary test system including an exemplary wafer under test including multiple exemplary test devices in accordance with one embodiment of the present invention. Test system 300 includes automated (i.e. computerized) test equipment 303 and test board 305. Test board 305 includes and interfaces with wafer under test 310, which can include test devices 302 and 304. Wafer under test 310 can also include additional test devices (not shown in FIG. 3), which are similar to test devices 302 and 304. Wafer under test 310 and test devices 302 and 304 correspond, respectively, to wafer under test 210 and test devices 202 and 204 in FIG. 2.

As shown in FIG. 3, test board 305 is coupled to automated test equipment 303 via buses 312 and 314. Test board 305 can include a number of interconnect traces (not shown in FIG. 3) to couple automated test equipment 303 to the appropriate contact pads on each test device on wafer under test 310. Although in the present embodiment wafer under test 310 is mounted on test board 305, in other embodiments wafer under test 310 may not be mounted on test board 305, and may be connected directly to automated test equipment 303 via a number of probes and buses 312 and 314.

Automated test equipment 303 can be configured to apply a suitable current to the appropriate contact pads (e.g. contact pads 114a and 114d on test device 102 in FIG. 1) on each test device to open a fuse (e.g. fuse 110) that couples a protection device (e.g. protection device 108) to a transistor gate. Automated test equipment 303 can be further configured to test the transistor in each test device to determine charge damage by measuring a selected transistor parameter, such as leakage current, via the appropriate contact pads on the test device and comparing the measured parameter to a reference value. Automated test equipment 303 can be further configured to perform a stress test on the transistor in each test device on wafer under test 310 via the appropriate contact pads on the test device.

It is noted that test system 300 can be configured, in one embodiment, to aid in improving wafer fabrication and/or reducing charge damage during actual production of wafers in a production line. In that embodiment, test devices and transistors are tested on a particular production wafer selected from wafers fabricated in a production line, and the results of testing the test devices and transistors are applied in real time, or stored and later applied, to production wafers that are awaiting fabrication in the production line in order to improve fabrication of those wafers and/or to reduce charge damage to those wafers.

Figure 4:
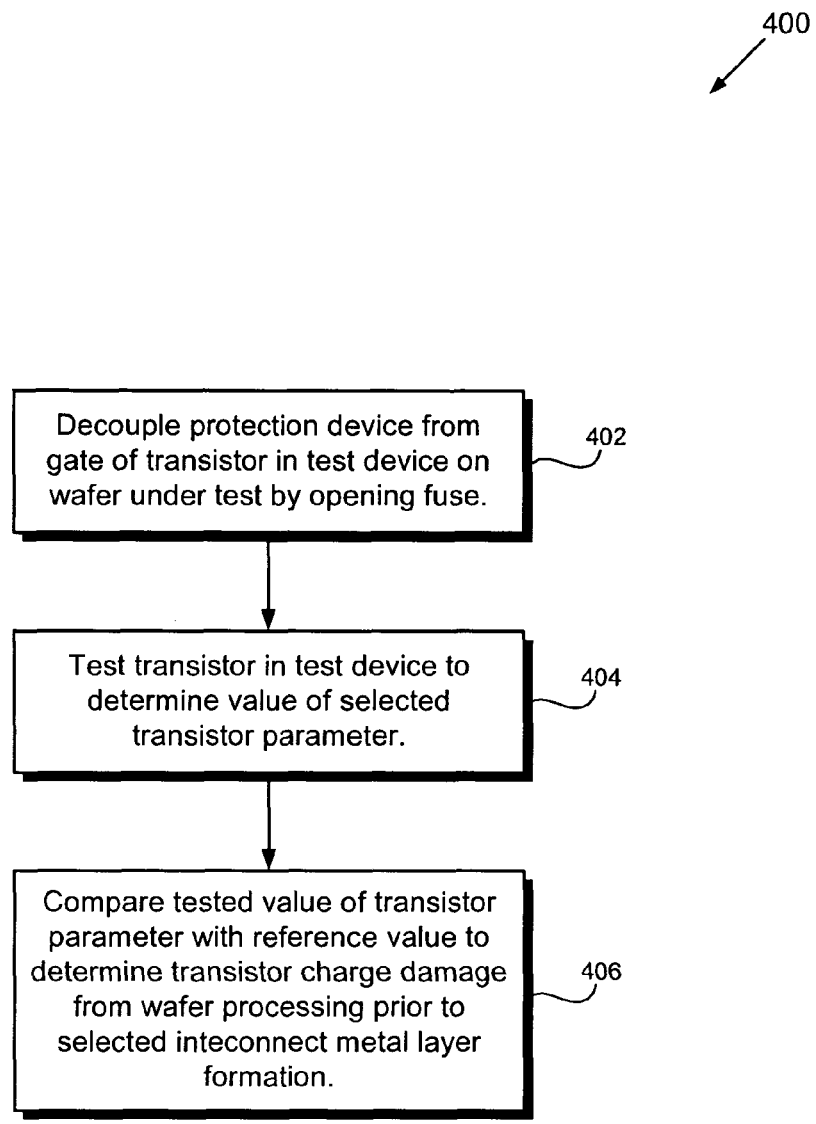
FIG. 4 shows a flowchart illustrating the steps taken to implement an embodiment of the present invention.

FIG. 4 shows a flowchart illustrating an exemplary method according to an embodiment of the present invention. Certain details and features have been left out of flowchart 400 that are apparent to a person of ordinary skill in the art. For example, a step may consist of one or more substeps or may involve specialized equipment or materials, as known in the art.

Referring now to step 402 of flowchart 400 in FIG. 4, protection device 110 in FIG. 1 is decoupled from the gate of transistor 106 in test device 102 on wafer under test 210 in FIG. 2 by opening fuse 110. Fuse 110 can be opened by applying a sufficient amount of current between contact pads 114a and 114d, which are formed in the top interconnect metal layer in wafer under test 210 and coupled to the respective terminals of fuse 110. At step 404, transistor 106 is tested to determine a value of a selected transistor parameter. For example, transistor 106 can be tested to determine leakage current. In one embodiment, transistor 106 may be tested to determine a value of more than one transistor parameter. In another embodiment, transistor 106 may be stress tested by applying a test signal(s) to the appropriate contact pads on test device 102.

At step 406, the tested value of the transistor parameter is compared to a reference value of the transistor parameter to determine the amount of charge damage to transistor 106 from wafer processing prior to the formation of the selected interconnect metal layer (i.e. the interconnect metal layer in which fuse 110 is coupled to the gate of transistor 106). For example, a tested value of leakage current can be compared to a reference value of leakage current to determine the amount of charge damage to transistor 106 from wafer processing prior to formation of the selected interconnect metal layer.

Thus, by providing a fuse that can be opened to decouple a protection device from a transistor gate in a test device in a wafer under test, the invention allows multiple transistors on the same wafer to be tested for damage from accumulated charge resulting from formation of different interconnect metal layers. In contrast, in a conventional test procedure, a test wafer is fabricated to include transistor and a desired number of overlying interconnect metal layer(s). The test wafer is then removed from the processing chamber and the transistor on the wafer is testing for charge damage. For each combination of overlying interconnect metal layers, the conventional test procedure requires the fabrication of a transistor on a different test wafer, which consumes valuable wafer fabrication time. Thus, by forming multiple test devices on a single test wafer, an embodiment of the invention disclosed in the present application advantageously eliminates the additional wafer fabrication time required in a conventional testing procedure. Additionally, by forming each transistor in each test device on the same substrate, the invention advantageously eliminates the effect of wafer-to-wafer variations on transistor test data.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a test device for determining charge damage to a transistor has been described.

The invention claimed is:

1. A test device comprising:
   a transistor situated over a substrate;
   a protection device coupled by a fuse to a gate of said transistor in an interconnect metal layer, said interconnect metal layer being formed over said substrate;
   wherein said fuse allows said protection device to be decoupled from said gate of said transistor, thereby preventing said gate of said transistor from being coupled to said substrate to facilitate testing said transistor.

2. The test device of claim 1 further comprising first and second contact pads formed over said substrate, wherein said first and second contact pads are coupled to respective first and second terminals of said fuse to provide access to said fuse.

3. The test device of claim 2, wherein said protection device is decoupled from said gate of said transistor by applying a current between said first and second contact pads so as to cause said fuse to open.

4. The test device of claim 1, wherein said fuse is formed in said interconnect metal layer.

5. The test device of claim 2 further comprising a third and a fourth contact pad situated over said substrate, wherein said third contact pad is coupled to a source of said transistor and said fourth contact pad is coupled to a drain of said transistor.

6. The test device of claim 1 further comprising an antenna coupled to said gate of said transistor, wherein said antenna comprises a plurality of interconnect metal segments for accumulating electrical charge during wafer processing.

7. The test device of claim 1, wherein said decoupling said protection device allows said transistor to be tested for charge damage that occurs from accumulated charge from wafer processing prior to formation of said interconnect metal layer.

8. The test device of claim 1, wherein said protection device comprises a diode, wherein a cathode of said diode is coupled to said fuse and an anode of said diode is coupled to said substrate.

* * * * *